United States Patent
Yamane

(10) Patent No.: US 8,179,017 B2
(45) Date of Patent: May 15, 2012

(54) BOUNDARY ACOUSTIC WAVE DEVICE HAVING THREE-MEDIUM STRUCTURE

(75) Inventor: Takashi Yamane, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/172,966

(22) Filed: Jun. 30, 2011

(65) Prior Publication Data

US 2011/0254406 A1    Oct. 20, 2011

Related U.S. Application Data

(63) Continuation of application No. PCT/JP2009/007274, filed on Dec. 25, 2009.

(30) Foreign Application Priority Data

Jan. 7, 2009    (JP) .................................. 2009-001666

(51) Int. Cl.
*H03H 9/25* (2006.01)
*H01L 41/08* (2006.01)

(52) U.S. Cl. ................................. 310/313 R; 310/313 B
(58) Field of Classification Search ............... 310/313 B, 310/313 R
See application file for complete search history.

(56) References Cited

U.S. PATENT DOCUMENTS

| | | | |
|---|---|---|---|
| 7,322,093 B2 * | 1/2008 | Kadota et al. | 29/594 |
| 2006/0138902 A1 * | 6/2006 | Kando | 310/313 D |
| 2007/0007852 A1 | 1/2007 | Kando | |
| 2007/0222337 A1 * | 9/2007 | Kadota et al. | 310/320 |
| 2007/0284965 A1 * | 12/2007 | Kadota et al. | 310/313 R |
| 2010/0141088 A1 * | 6/2010 | Matsuda et al. | 310/313 R |
| 2010/0225201 A1 | 9/2010 | Roesler et al. | |
| 2011/0050034 A1 | 3/2011 | Yamane | |

FOREIGN PATENT DOCUMENTS

| | | |
|---|---|---|
| EP | 1 879 291 A1 | 1/2008 |
| WO | 98/52279 A1 | 11/1998 |
| WO | 2005/069485 A1 | 7/2005 |
| WO | 2006/114930 A1 | 11/2006 |
| WO | 2007/085237 A1 | 8/2007 |
| WO | 2009/139108 A1 | 11/2009 |

OTHER PUBLICATIONS

Official Communication issued in International Patent Application No. PCT/JP2009/007274, mailed on Mar. 16, 2010.

* cited by examiner

*Primary Examiner* — Jaydi San Martin
(74) *Attorney, Agent, or Firm* — Keating & Bennett, LLP

(57) ABSTRACT

A boundary acoustic wave device that has a three-medium structure and that prevents a high-order mode spurious response includes a piezoelectric substrate, a first dielectric layer laminated on the piezoelectric substrate, a second dielectric layer laminated on the first dielectric layer, and an IDT electrode provided at an interface between the piezoelectric substrate and the first dielectric layer. The boundary acoustic wave device utilizes a Stoneley wave that propagates along the interface. Where V1 denotes an acoustic velocity of a slow transversal bulk wave in the piezoelectric substrate and Va denotes an acoustic velocity at an anti-resonant point in a high-order mode of the Stoneley wave, Va>V1 is satisfied.

8 Claims, 6 Drawing Sheets

BOUNDARY ACOUSTIC WAVE DEVICE HAVING THREE-MEDIUM STRUCTURE

BACKGROUND OF THE INVENTION

1. Field of the Invention

The present invention relates to a boundary acoustic wave device used, for example, as a band-pass filter or a resonator, and more particularly, to a boundary acoustic wave device having a three-medium structure in which first and second dielectric layers are laminated on a piezoelectric substrate.

2. Description of the Related Art

Since a package can be omitted and size reduction can be achieved, boundary acoustic wave devices have been attracting attention as alternatives to surface acoustic wave devices. International Publication No. 2007/85237 described below discloses a boundary acoustic wave device that utilizes an SH type boundary acoustic wave or a Stoneley wave as a boundary acoustic wave.

FIG. 8 is a schematic partially cutaway front cross-sectional view of the boundary acoustic wave device described in International Publication No. 2007/85237.

A boundary acoustic wave device 1001 includes a piezoelectric substrate 1002 and first and second dielectric layers 1003 and 1004 laminated on the piezoelectric substrate 1002. In other words, the boundary acoustic wave device 1001 is a boundary acoustic wave device having a three-medium structure.

An IDT electrode 1005 is located between the piezoelectric substrate 1002 and the first dielectric layer 1003. Here, the first dielectric layer 1003 is made of $SiO_2$. The thickness of the first dielectric layer 1003 made of $SiO_2$ is preferably in the range from 20% to 200% of the wavelength of the boundary acoustic wave, where the wavelength of the boundary acoustic wave is indicated by $\lambda$. It is stated that by setting the thickness of the $SiO_2$ layer in this range, a spurious response can be suppressed and good filter characteristics can be obtained.

In a boundary acoustic wave device having a three-medium structure as described above, for example, when a Stoneley wave is utilized, a response in a higher-order mode of the Stoneley wave is good. In other words, a higher-order mode spurious response tends to appear. The magnitude of the higher-order mode spurious response can be reduced by reducing the thickness of the $SiO_2$ layer.

However, while the thickness range of the $SiO_2$ layer in which the higher-order mode spurious response is suppressed is different between the case in which the SH type boundary wave is utilized and the case in which the Stoneley wave is utilized, it is merely stated in International Publication No. 2007/85237 that when either boundary acoustic wave is utilized, the thickness of the $SiO_2$ layer is preferably in the range from 20% to 200% of the wavelength $\lambda$.

SUMMARY OF THE INVENTION

To overcome the problems described above, preferred embodiments of the present invention provide a structure that more effectively prevents a higher-order spurious response in a boundary acoustic wave device that has a three-medium structure and that utilizes a Stoneley wave.

According to a preferred embodiment of the present invention, a boundary acoustic wave device preferably includes a piezoelectric substrate, a first dielectric layer laminated on the piezoelectric substrate, a second dielectric layer laminated on the first dielectric layer, and an IDT electrode provided at an interface between the piezoelectric substrate and the first dielectric layer. The boundary acoustic wave device utilizes a Stoneley wave that propagates along the interface, $Va>V1$ is satisfied where $V1$ denotes an acoustic velocity of a slow transversal bulk wave in the piezoelectric substrate and $Va$ denotes an acoustic velocity at an anti-resonant point in a higher-order mode of the Stoneley wave.

In the boundary acoustic wave device according to another preferred embodiment of the present invention, preferably, $Vp_{max}>V1$ is satisfied where $Vp_{max}$ denotes an acoustic velocity at a maximum phase in the higher-order mode. Thus, a higher-order mode spurious response is more effectively prevented. Even more preferably, $Vr>V1$ is satisfied where $Vr$ denotes an acoustic velocity at a resonant point in the higher-order mode. In this case, a high-order mode spurious response is even more effectively prevented.

In the boundary acoustic wave device according to a preferred embodiment of the present invention, the piezoelectric substrate is made of an appropriate piezoelectric material, and preferably is made of $LiNbO_3$, for example. Thus, the electromechanical coupling coefficient can be increased.

Further, in a boundary acoustic wave device according to another preferred embodiment of the present invention, the first dielectric layer is preferably made of $SiO_2$ or SiON, for example. In this case, the absolute value of the frequency temperature coefficient of the boundary acoustic wave device can be reduced so as to improve the frequency temperature characteristics. In addition, a higher-order mode spurious response is effectively prevented.

Preferably, the first dielectric layer is made of $SiO_2$, for example, and a normalized thickness that is obtained by normalizing a thickness of the first dielectric layer with a wavelength $\lambda$ of the Stoneley wave is preferably equal to or less than about 1.4. Thus, a higher-order mode spurious response is effectively prevented.

In the boundary acoustic wave device according to another preferred embodiment of the present invention, preferably, the first dielectric layer is made of $SiO_2$, for example, and when a duty ratio of the IDT electrode and $h\times a/\lambda$ obtained by multiplying a wavelength normalized thickness $h/\lambda$ of the IDT electrode, which is obtained by normalization with a wavelength $\lambda$, by a ratio $a$ of a density of the IDT electrode to a density of Pt, are within each of regions J1 to J13 shown in FIG. 9, a wavelength normalized thickness $H/\lambda$ of the first dielectric layer, which is obtained by normalization with the wavelength $\lambda$, is preferably equal to or less than a value described in Table 1 below. In this case, a higher-order mode spurious response is assuredly prevented.

TABLE 1

| | Normalized thickness of first dielectric layer (H/λ) |
|---|---|
| J1 | 1.40 |
| J2 | 1.39 |
| J3 | 1.38 |
| J4 | 1.37 |
| J5 | 1.36 |
| J6 | 1.35 |
| J7 | 1.34 |
| J8 | 1.33 |
| J9 | 1.32 |
| J10 | 1.31 |
| J11 | 1.30 |
| J12 | 1.29 |
| J13 | 1.28 |

Further, in the boundary acoustic wave device according to a preferred embodiment of the present invention, the first dielectric layer is preferably made of $SiO_2$, and when an Euler angle θ of the piezoelectric substrate and h×a/λ obtained by multiplying a wavelength normalized thickness h/λ of the IDT electrode, which is obtained by normalization with a wavelength λ, by a ratio a of a density of the IDT electrode to a density of Pt, are within each of regions K1 to K11 shown in FIG. 10, a wavelength normalized thickness H/λ of the first dielectric layer, which is obtained by normalization with the wavelength λ, is preferably equal to or less than a value described in Table 2 below. In this case, a higher-order mode spurious response is assuredly prevented.

TABLE 2

| | Normalized thickness of first dielectric layer (H/λ) |
|---|---|
| K1 | 1.39 |
| K2 | 1.38 |
| K3 | 1.37 |
| K4 | 1.36 |
| K5 | 1.35 |
| K6 | 1.34 |
| K7 | 1.33 |
| K8 | 1.32 |
| K9 | 1.31 |
| K10 | 1.30 |
| K11 | 1.29 |

According to various preferred embodiments of the present invention, since Va>V1 is satisfied, a higher-order mode spurious response is effectively prevented in a boundary acoustic wave device using a Stoneley wave. Thus, a boundary acoustic wave device having excellent frequency characteristics is provided.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be disclosed with reference to the drawings.

Figure 1A:
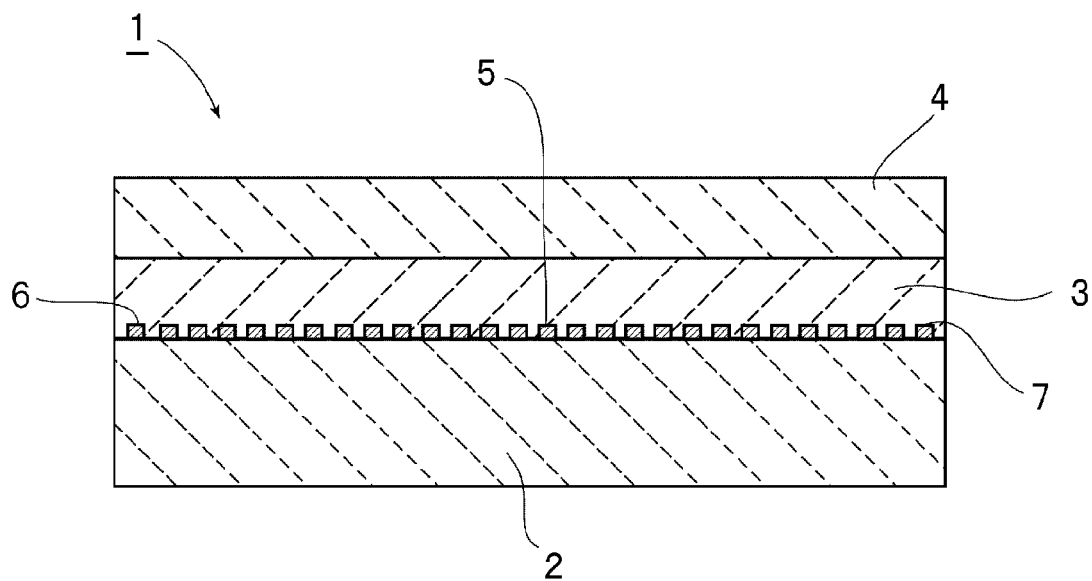
FIG. 1A is a schematic front cross-sectional view of a boundary acoustic wave device according to a preferred embodiment of the present invention.
Figure 1B:
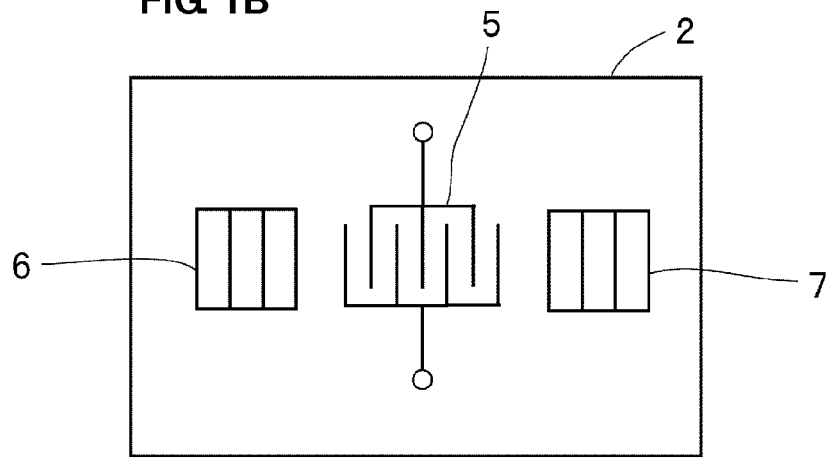
FIG. 1B is a schematic plan view showing an electrode structure.
Figure 2:
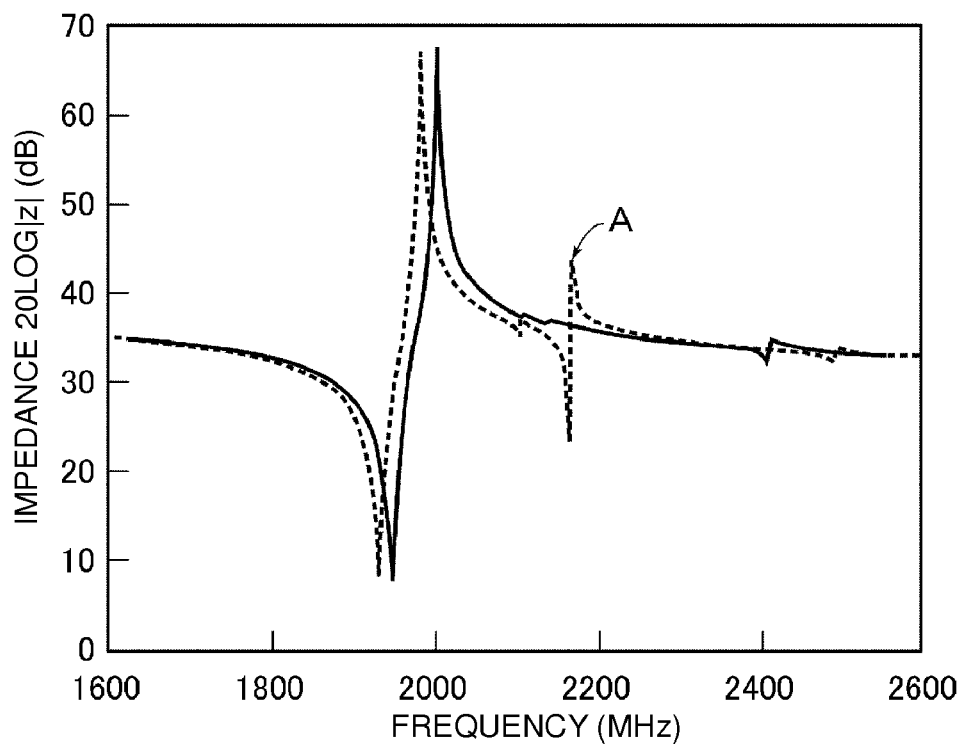
FIG. 2 is a graph showing the impedance characteristics of boundary acoustic wave devices according to a preferred embodiment of the present invention and a comparative example.
Figure 3:
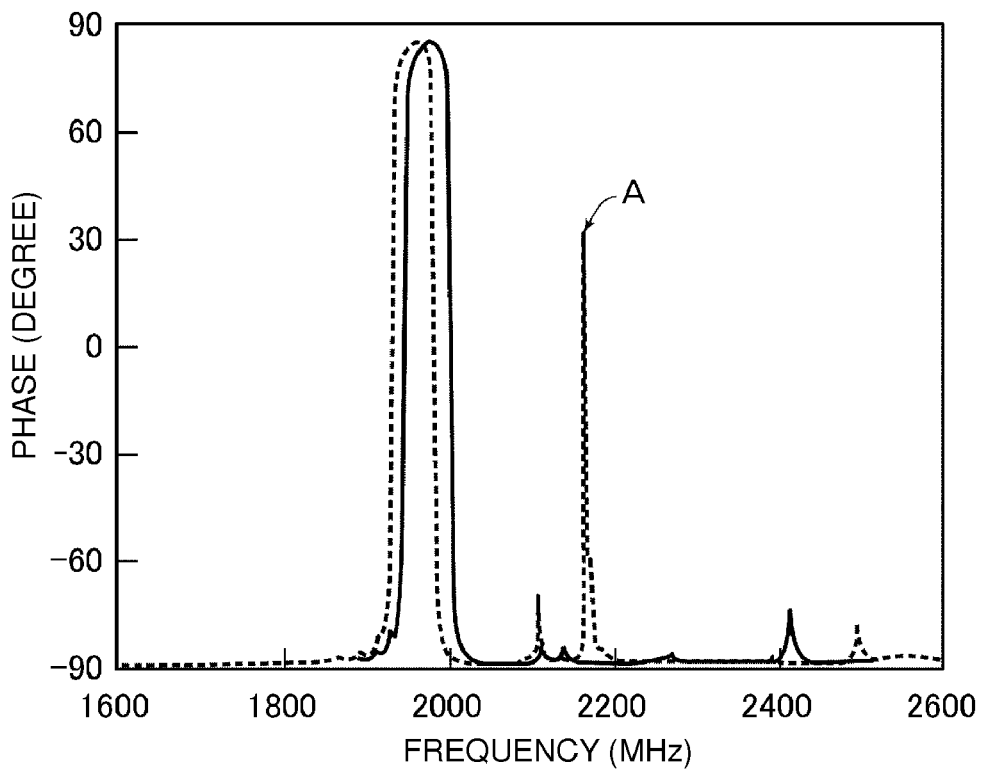
FIG. 3 is a graph showing the phase characteristics of the boundary acoustic wave devices according to a preferred embodiment of the present invention and the comparative example.
Figure 4:
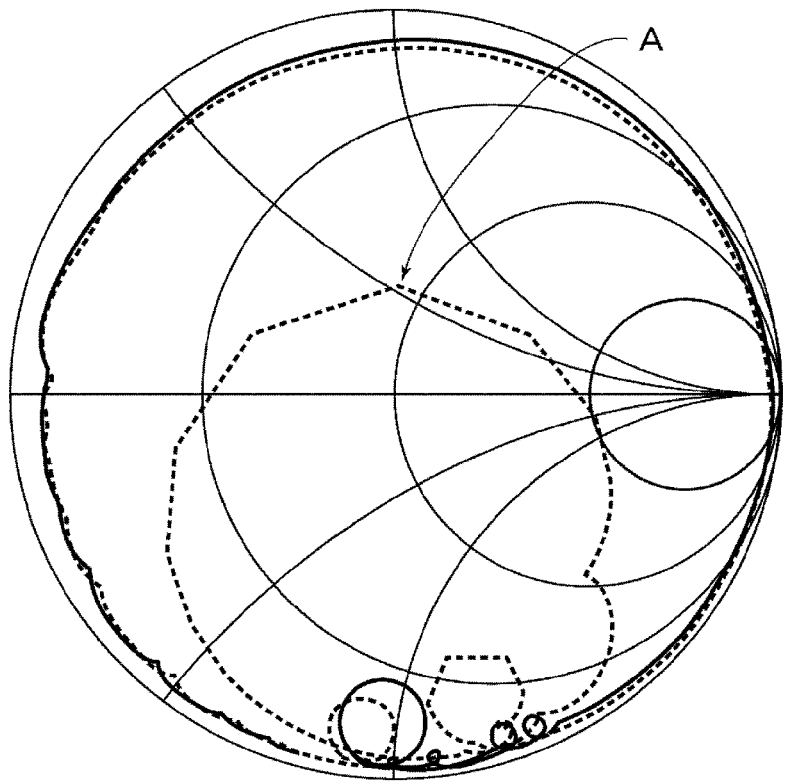
FIG. 4 is a Smith chart of the impedance characteristics of the boundary acoustic wave devices according to a preferred embodiment of the present invention and the comparative example.
Figure 5:
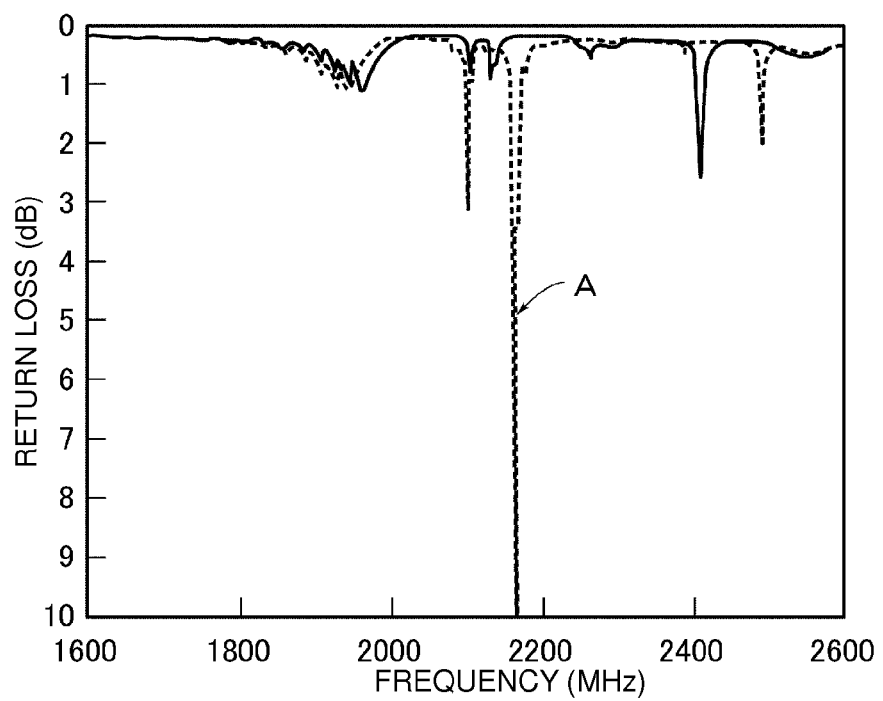
FIG. 5 is a graph showing the return loss characteristics of the boundary acoustic wave devices according to a preferred embodiment of the present invention and the comparative example.

FIGS. 1A and 1B are a schematic front cross-sectional view of a boundary acoustic wave device according to a preferred embodiment of the present invention and a schematic plan view showing its electrode structure. A boundary acoustic wave device 1 preferably includes a piezoelectric substrate 2 and first and second dielectric layers 3 and 4. In other words, the boundary acoustic wave device 1 according to the present preferred embodiment is a boundary acoustic wave device having a three-medium structure.

An electrode structure is provided between the piezoelectric substrate 2 and the first dielectric layer 3 and includes an IDT electrode 5 and reflectors 6 and 7.

The piezoelectric substrate 2 is preferably made of LiNbO$_3$ having Euler angles (0°, 30°, 0°), for example. However, LiNbO$_3$ having other Euler angles may be used, or other piezoelectric monocrystals, such as LiTaO$_3$, for example, may be used.

In the present preferred embodiment, the first dielectric layer 3 is preferably made of SiO$_2$, for example. Where a wavelength determined by the electrode finger pitch of the IDT electrode 5 of the boundary acoustic wave device 1 is indicated by λ, a normalized thickness of the SiO$_2$ layer that is obtained by normalization with the wavelength λ is preferably set to about 0.8, for example. In other words, the thickness of the first dielectric layer 3 is preferably about 80% of λ.

In the present preferred embodiment, the second dielectric layer 4 laminated on the first dielectric layer 3 is preferably made of SiN, for example, and a normalized thickness of the second dielectric layer 4 that is obtained by normalization with the wavelength λ is preferably set to about 1.16, for example. The second dielectric layer 4 may be made of SiO$_2$, SiON, Si, SiC, AlN, AlO, DLC (diamond-like carbon), or other suitable material, other than SiN, for example.

It should be noted that in the present preferred embodiment, the IDT electrode 5 is preferably a laminated metal film in which an Al film and a Pt film are laminated in order from the top, for example. The thicknesses of the Al film and the Pt film are preferably set to be within a range of about 7.9% to about 4.0% of the wavelength λ, respectively, for example.

As shown in FIG. 1B, the reflectors 6 and 7 are provided on both sides of the IDT electrode 5 in a boundary acoustic wave propagating direction in which a boundary acoustic wave propagates. The IDT electrode 5 and the reflectors 6 and 7 define a one-port boundary acoustic wave resonator.

In the boundary acoustic wave device 1 according to the present preferred embodiment, when the acoustic velocity of a slow transversal bulk wave in the piezoelectric substrate 2 is indicated by V1 and the acoustic velocity at an anti-resonant point in a higher-order mode of a Stoneley wave (boundary acoustic wave) is indicated by Va, Va>V1 is satisfied, whereby the higher-order mode spurious response is effectively prevented. More preferably, when the acoustic velocity at the maximum phase in the higher-order mode is indicated by $Vp_{max}$, $Vp_{max}$>V1 is satisfied. In this case, a higher-order mode spurious response is more effectively prevented. Even more preferably, when the acoustic velocity at a resonant point in the higher-order mode is indicated by Vr, Vr>V1 is satisfied. In this case, the higher-order mode spurious response is prevented. This will be described below based on specific experimental examples.

The acoustic velocity Va at the anti-resonant point in the higher-order mode is an acoustic velocity value calculated based on an open grating circuit model. The acoustic velocity Vr at the resonant point in the higher-order mode is an acoustic velocity value calculated based on a short grating circuit model.

Figure 6:
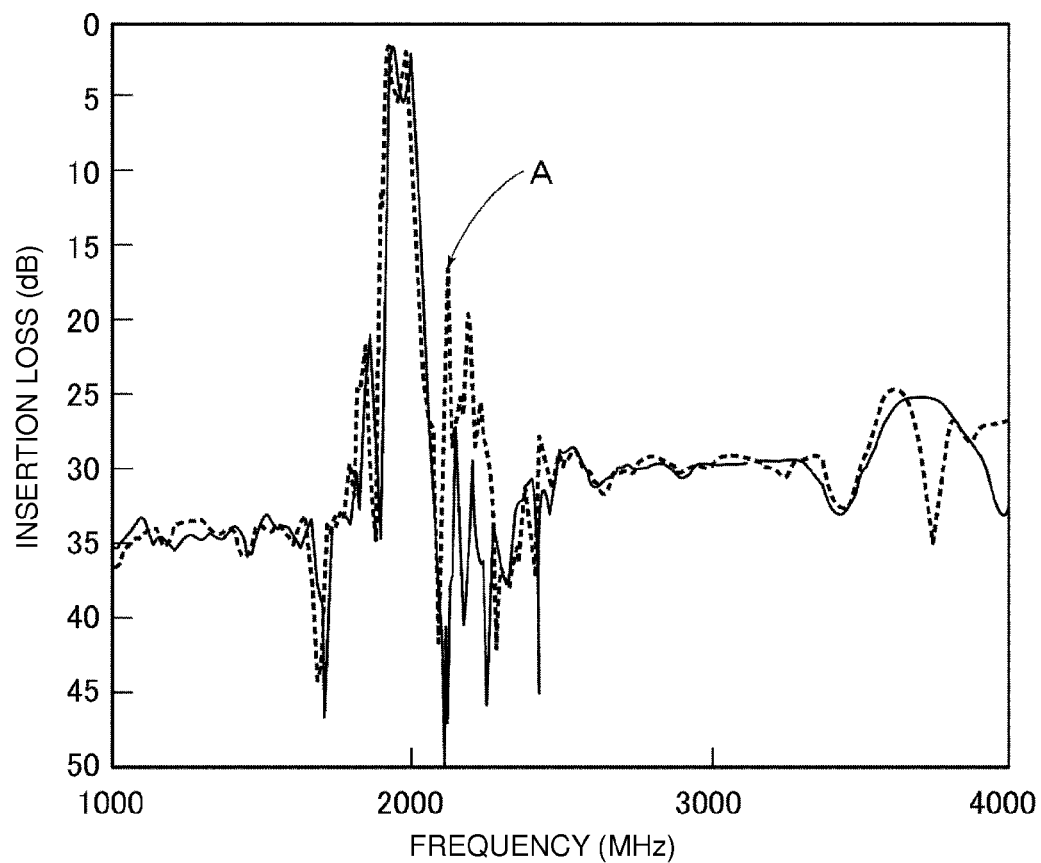
FIG. 6 is a graph showing the insertion loss characteristics of the boundary acoustic wave devices according to a preferred embodiment of the present invention and the comparative example.

In order to compare to the boundary acoustic wave device 1 according to the present preferred embodiment, a boundary acoustic wave device of a comparative example was manufactured which has substantially the same configuration as that of the boundary acoustic wave device 1 according to the present preferred embodiment except that the normalized thickness of the $SiO_2$ layer is about 143.8% of λ. FIGS. 2 to 5 show the impedance characteristics, the phase characteristics, the impedance Smith chart, and the return loss characteristics of the boundary acoustic wave devices according to the preferred embodiment and the comparative example, and FIG. 6 shows insertion loss characteristics.

In FIGS. 2 to 6, the solid lines show the results of the present preferred embodiment, and the broken lines show the results of the comparative example. In FIGS. 2 to 6, a response indicated by the arrow A is a response of the higher-order mode appearing on the high frequency side of a response in a fundamental mode. The response of the higher-order mode appears as a higher-order mode spurious response. The higher-order mode is a spurious mode in which P wave and SV wave components propagating along an upper surface of the $SiO_2$ layer and between the $SiO_2$ layer and the piezoelectric substrate are main components.

The number of pairs of electrode fingers of the IDT electrode 5 is 60, and the overlap widths of the electrode fingers are about 30λ (λ=1.9 μm), and the duty ratio of the IDT electrode 5 is about 0.5.

For the reflectors 6 and 7, the number of electrode fingers is 25, and the duty ratio is about 0.5.

As shown in FIGS. 2 to 6, the acoustic velocity in the higher-order mode is greater in the boundary acoustic wave device according to the present preferred embodiment than in the boundary acoustic wave device of the comparative example. In other words, it appears that in the present preferred embodiment, the acoustic velocity in the higher-order mode that is indicated by the arrow A exceeds about 4,050 m/sec, which is the slow transversal acoustic velocity V1 in $LiNbO_3$. Further, as is evident from the phase values in FIG. 3, it appears that the response of the higher-order mode is small. The slow transverse acoustic velocity V1 varies in accordance with an Euler angle. Here, an acoustic velocity V (m/s) and a frequency f (MHz) can be converted using the equation, V (m/s)=1.9 (μm)×f (MHz), where the wavelength λ=1.9 μm.

In the present preferred embodiment, the reason why the response of the higher-order mode is small and the higher-order mode spurious response is prevented as described above is considered as follows. Specifically, since the thickness of $SiO_2$ is preferably reduced from about 143.8% to about 80% of λ, the acoustic velocity in the higher-order mode is increased, and the acoustic velocity Va at the anti-resonant point in the higher-order mode is about 4400 m/sec, which exceeds the slow transversal acoustic velocity V1 of $LiNbO_3$=about 4050 m/sec. In the present preferred embodiment, since Va>V1 is satisfied as described above, it is thought that the higher-order mode leaks to the $LiNbO_3$ side and the higher-order mode spurious response is prevented. The acoustic velocity Vr at the resonant point is less than the acoustic velocity Va at the anti-resonant point in the higher-order mode. Thus, when Vr>V1, the higher-order mode leaks further to the $LiNbO_3$ substrate side, and the higher-order mode spurious response is prevented.

Further, the acoustic velocity $Vp_{max}$ at the maximum phase in the higher-order mode is located between Va and Vr. Thus, when $Vp_{max}$>V1, the higher-order mode leaks to the $LiNbO_3$ side more assuredly than when Va>V1, and the higher-order mode spurious response is prevented.

Therefore, preferably, $Vp_{max}$>V1, and more preferably, Vr>V1.

In the present preferred embodiment, by adjusting the thickness of the $SiO_2$ layer, the acoustic velocity Va at the anti-resonant point in the higher-order mode is greater than V1. However, by changing elements other than the thickness of the $SiO_2$ layer, the acoustic velocity Va at the anti-resonant point in the higher-order mode may be greater than V1.

As is evident from the results of the present preferred embodiment and the comparative example, it appears that when the thickness of the $SiO_2$ layer is changed, the acoustic velocity in the higher-order mode and the magnitude of the response of the higher-order mode change.

Figure 7:
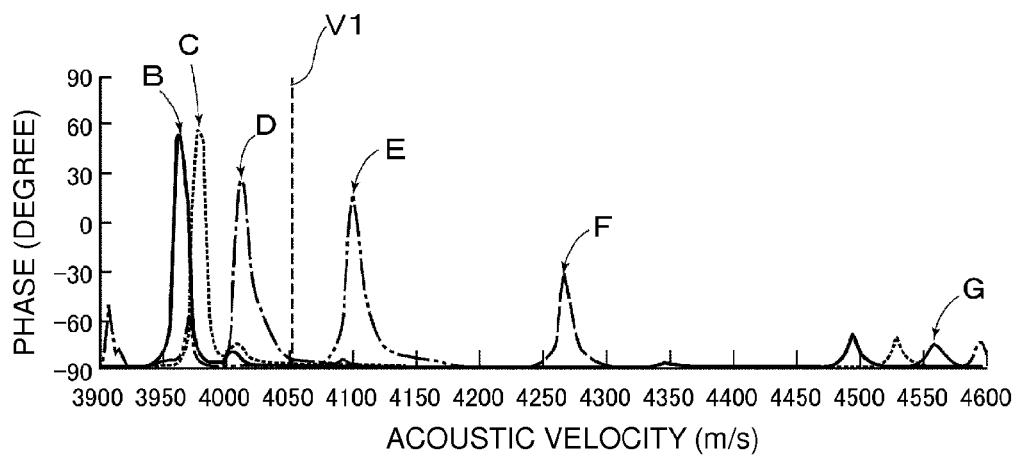
FIG. 7 is a diagram showing the higher-order mode phase characteristics of each boundary acoustic wave device in which the thickness of an SiO$_2$ layer is about 152.0%, about 147.8%, about 140.0%, about 126.7%, about 95.0%, or about 72.4% of λ.
Figure 8:
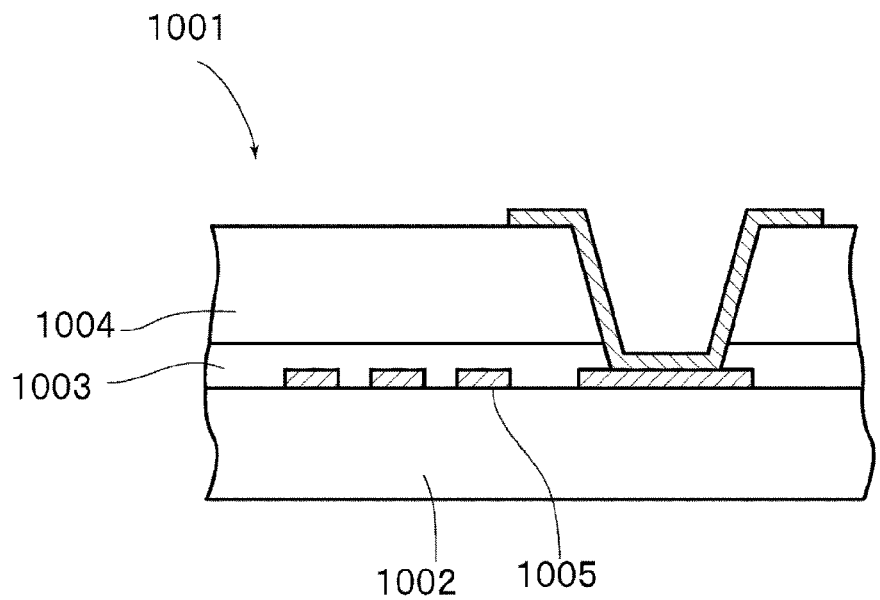
FIG. 8 is a schematic front cross-sectional view of a known boundary acoustic wave device.

FIG. 7 is a diagram showing the phase characteristics of a portion, at which a higher-order mode appears, of each boundary acoustic wave device that was manufactured in substantially the same manner as the preferred embodiment described above except that the thickness of the $SiO_2$ layer was changed to about 152%, about 147.8%, about 140%, about 126.7%, about 95%, or about 72.4% of the wavelength λ. In FIG. 7, arrows B to G indicate a response of the higher-order mode when the thickness of the $SiO_2$ layer is about 152.0%, about 147.8%, about 140.0%, about 126. %, about 95.0%, or about 72.4%.

As shown in FIG. 7, when the thickness of the $SiO_2$ layer is equal to or less than about 140%, the magnitude of the response of the higher-order mode is remarkably reduced as compared to that when the thickness of the $SiO_2$ layer exceeds about 140%. Further, when the thickness of the $SiO_2$ layer is equal to or less than about 95%, the response of the higher-order mode is further reduced. Moreover, the response of the higher-order mode tends to decrease when the thickness of the $SiO_2$ layer decreases.

However, when the thickness of the $SiO_2$ layer is too small, a sufficient effect of decreasing the absolute value of a temperature coefficient of frequency TCF by laminating the $SiO_2$ layer may not be obtained. Thus, the thickness of the $SiO_2$ layer is preferably equal to or greater than about 20% of λ.

The thickness of $SiO_2$ is more preferably from about 20% to about 140% of λ, even more preferably from about 20% to about 95% of λ, and even more preferably from about 20% to about 72% of λ.

The thicknesses of the $SiO_2$ layers, the normalized thicknesses, and the phase maximums $P_{max}$ of the responses of the higher-order modes of the boundary acoustic wave devices indicated by the arrows B to G in FIG. 7 are shown in Table 3 below.

TABLE 3

| Arrow in FIG. 7 | λ (μm) | $SiO_2$ thickness (μm) | $SiO_2$ thickness with respect to λ | Phase maximum (degree) |
| --- | --- | --- | --- | --- |
| G | 2.1 | 1.52 | 72.4% | −72.5 |
| F | 1.6 | 1.52 | 95.0% | −29.7 |
| E | 2.1 | 2.66 | 126.7% | 17.5 |
| D | 1.9 | 2.66 | 140.0% | 27.8 |
| C | 1.8 | 2.66 | 147.8% | 57.9 |
| B | 1.75 | 2.66 | 152.0% | 54.5 |

Further, boundary acoustic wave devices were manufactured in substantially the same manner as the preferred embodiment described above except that the IDT electrode 5 was made of a Pt film and the duty ratio of the IDT electrode 5 and the thickness of the IDT electrode were variously changed, and the occurrence of a higher-order mode spurious response was examined.

Figure 9:
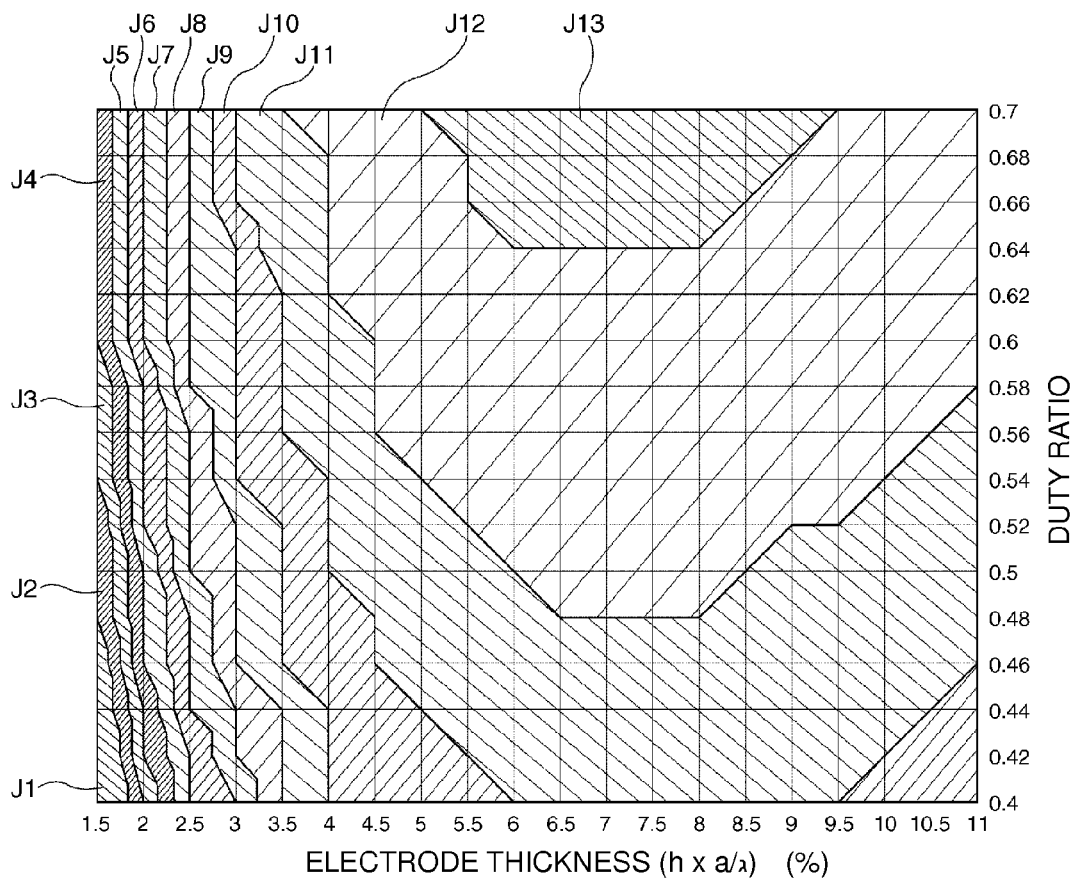
FIG. 9 is a graph for defining regions J1 to J13, representing a duty ratio of an IDT electrode and h×a/λ obtained by multiplying a wavelength normalized thickness h/λ of the IDT electrode, which is obtained by normalization with a wavelength λ, by the ratio a of the density of the IDT electrode to the density of Pt.

As a result, it appears that the higher-order mode spurious response is effectively prevented if the normalized thickness H/λ of the first dielectric layer 3, which is obtained by normalization with the wavelength λ, is equal to or less than a value described in Table 4 below, when the duty ratio of the IDT electrode 5 and h×a/λ obtained by multiplying a wavelength normalized thickness h/λ of the IDT electrode 5, which is obtained by normalization with the wavelength λ, by the ratio a of the density of the IDT electrode to the density of Pt, are within each of regions J1 to J13 shown in FIG. 9.

TABLE 4

| | Normalized thickness of first dielectric layer (H/λ) |
| --- | --- |
| J1 | 1.40 |
| J2 | 1.39 |
| J3 | 1.38 |
| J4 | 1.37 |
| J5 | 1.36 |
| J6 | 1.35 |
| J7 | 1.34 |
| J8 | 1.33 |
| J9 | 1.32 |
| J10 | 1.31 |
| J11 | 1.30 |
| J12 | 1.29 |
| J13 | 1.28 |

Further, boundary acoustic wave devices were manufactured in substantially the same manner as the preferred embodiment described above except that the IDT electrode 5 was made of a Pt film and the Euler angle θ of the piezoelectric substrate and the thickness of the IDT electrode were variously changed, and the occurrence of a higher-order mode spurious response was examined.

Figure 10:
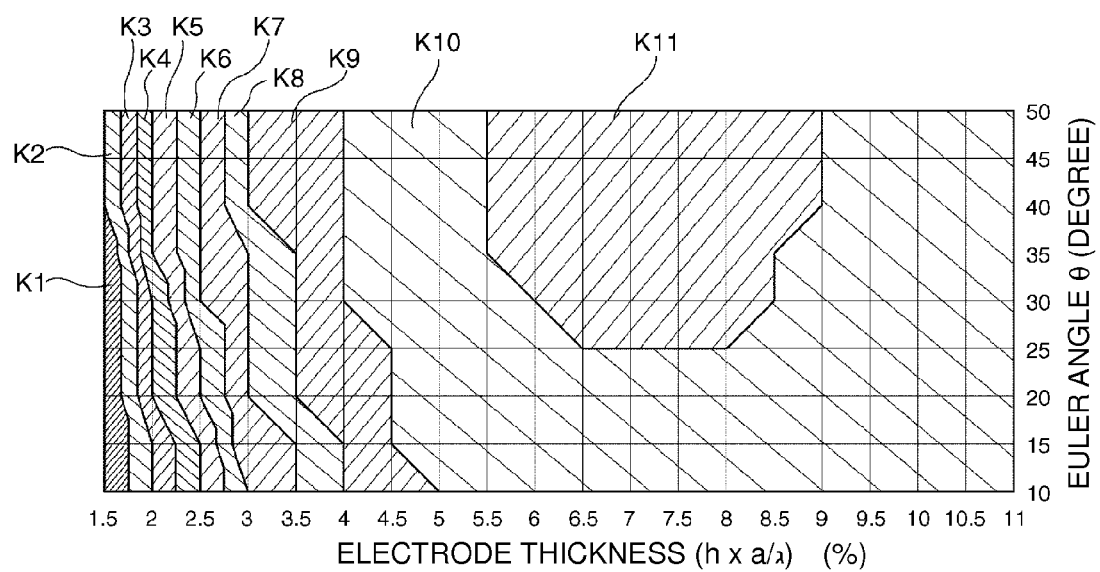
FIG. 10 is a graph for defining regions K1 to K11, representing an Euler angle of a piezoelectric substrate and h×a/λ obtained by multiplying the wavelength normalized thickness h/λ of the IDT electrode, which is obtained by normalization with the wavelength λ, by the ratio a of the density of the IDT electrode to the density of Pt.

As a result, the higher-order mode spurious can be effectively prevented if the normalized thickness H/λ of the first dielectric layer 3, which is obtained by normalization with the wavelength λ, is equal to or less than a value described in Table 5 below, when the Euler angle θ of the piezoelectric substrate 2 and h×a/λ obtained by multiplying a wavelength normalized thickness h/λ of the IDT electrode 5, which is obtained by normalization with the wavelength λ, by the ratio a of the density of the IDT electrode to the density of Pt, are within each of regions K1 to K11 shown in FIG. 10.

TABLE 5

| | Normalized thickness of first dielectric layer (H/λ) |
| --- | --- |
| K1 | 1.39 |
| K2 | 1.38 |
| K3 | 1.37 |
| K4 | 1.36 |
| K5 | 1.35 |
| K6 | 1.34 |
| K7 | 1.33 |
| K8 | 1.32 |
| K9 | 1.31 |
| K10 | 1.30 |
| K11 | 1.29 |

In the examples described above, the IDT electrode 5 is preferably made of a Pt film, for example. However, the ranges of the normalized thickness H/λ of the first dielectric layer 3, which are shown in Tables 4 and 5, are also suitably applied to a case in which the IDT electrode 5 is made of a conductive film other than the Pt film. In other words, the IDT electrode may preferably be made of at least one metal selected from the group consisting of Al, Ti, Fe, Cu, Ag, Ta, Au, and Pt, or an alloy including at least one metal selected from the group consisting of Al, Ti, Fe, Cu, Ag, Ta, Au, and Pt, for example. Further, the IDT electrode may preferably be made of a laminate of conductive films made of these metals and alloys.

In the preferred embodiment described above, the first dielectric layer 3 is preferably made of $SiO_2$, for example, but may be made of another dielectric material, such as SiON, for example.

In the specification, the meanings of Euler angles, crystallographic axes, and equivalent Euler angles are as follows.

In the specification, as Euler angles (φ, θ, ψ) that represent a cut plane of a substrate and a propagating direction in which a boundary wave propagates, right-hand Euler angles that are described in the literature "Danseihasoshi Gijutsu Handobukku (Handbook of Acoustic Wave Device Technology)" (the Japan Society for the Promotion of Science, 150th Committee on Acoustic Wave Device Technology, 1st edition, 1st printing, published on Jan. 30, 1991, p. 549) are preferably used. In other words, for example, for crystallographic axes X, Y, and Z of $LiNbO_3$, the X-axis is rotated by φ counterclockwise about the Z-axis to obtain an Xa-axis. Next, the Z-axis is rotated by θ counterclockwise about the Xa-axis to obtain a Z'-axis. A plane that includes the Xa-axis and that has a normal line that is the Z'-axis is set as the cut plane of the substrate. The X'-axis direction obtained by rotating the Xa-axis by ψ counterclockwise about the Z'-axis is set as the propagating direction in which the boundary wave propagates.

The crystallographic axes X, Y, and Z provided as initial values of the Euler angles are parallel to the c-axis, the X-axis is parallel to any one of a-axes of equivalent three directions, and the Y-axis is a normal direction of a plane that includes the X-axis and the Z-axis.

It suffices that the Euler angles (φ, θ, ψ) in various preferred embodiments of the present invention are crystallographically equivalent to each other. For example, according to the literature (the Journal of Acoustical Society of Japan, Vol. 36, No. 3, 1980, p 140-145), LiNbO$_3$ and LiTaO$_3$ are crystals belonging to the trigonal system 3m point group, and thus the following equation (1) is satisfied.

$$F(\phi, \theta, \psi) = F(60° - \phi, -\theta, 180° - \psi) \quad \text{Equation (1)}$$
$$= F(60° + \phi, -\theta, \psi)$$
$$= F(\phi, 180° + \theta, 180° - \psi)$$
$$= F(\phi, \theta, 180° + \psi)$$

Here, F is any boundary wave characteristic, such as electromechanical coupling coefficient $k_s^2$, propagation loss, TCF, PFA, natural unidirectional property, for example. In the natural unidirectional property of the PFA, when the propagation direction is reversed, for example, the absolute magnitude is unchanged while the sign reverses. Thus, their natural unidirectional properties are considered as being practically equivalent to each other. While the above literature relates to a surface wave, the same treatment applies to the crystal symmetry of a boundary wave.

For example, the propagation characteristics of a boundary wave having Euler angles of (30°, θ, ψ) are equivalent to the propagation characteristics of a boundary wave having Euler angles of (90°, 180°−θ, 180°−ψ). In addition, for example, the propagation characteristics of a boundary wave having Euler angles of (30°, 90°, 45°) are equivalent to the propagation characteristics of boundary waves having Euler angles shown in Table 6.

The material constants for a conductor used for calculation in various preferred embodiments of the present invention are the material constants for a polycrystal. Even in a crystal such as an epitaxial film, the crystal orientation dependence of a substrate predominates over the crystal orientation dependence of a film in the boundary wave characteristics. Thus, by the equation (1), the equivalent propagation characteristics of a boundary wave can be obtained to such a degree as to cause no practical problem.

TABLE 6

| φ(°) | θ(°) | ψ(°) |
|------|------|------|
| 30   | 90   | 225  |
| 30   | 270  | 135  |
| 30   | 270  | 315  |
| 90   | 90   | 135  |
| 90   | 90   | 315  |
| 90   | 270  | 45   |
| 90   | 270  | 225  |
| 150  | 90   | 45   |
| 150  | 90   | 225  |
| 150  | 270  | 135  |
| 150  | 270  | 315  |
| 210  | 90   | 135  |
| 210  | 90   | 315  |
| 210  | 270  | 45   |
| 210  | 270  | 225  |
| 270  | 90   | 45   |
| 270  | 90   | 225  |
| 270  | 270  | 135  |
| 270  | 270  | 315  |
| 330  | 90   | 135  |
| 330  | 90   | 315  |
| 330  | 270  | 45   |
| 330  | 270  | 225  |

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A boundary acoustic wave device comprising:
   a piezoelectric substrate;
   a first dielectric layer laminated on the piezoelectric substrate and having a set thickness;
   a second dielectric layer laminated on the first dielectric layer; and
   an IDT electrode provided at an interface between the piezoelectric substrate and the first dielectric layer; wherein
   the boundary acoustic wave device utilizes a Stoneley wave that propagates along the interface, and the thickness of the first dielectric layer is set such that Va>V1 is satisfied, where V1 denotes an acoustic velocity of a slow transversal bulk wave in the piezoelectric substrate and Va denotes an acoustic velocity at an anti-resonant point in a higher-order mode of the Stoneley wave.

2. The boundary acoustic wave device according to claim 1, wherein $Vp_{max}$>V1 is satisfied where $Vp_{max}$ denotes an acoustic velocity at a maximum phase in the higher-order mode.

3. The boundary acoustic wave device according to claim 1, wherein Vr>V1 is satisfied where Vr denotes an acoustic velocity at a resonant point in the higher-order mode.

4. The boundary acoustic wave device according to claim 1, wherein the piezoelectric substrate is made of LiNbO$_3$.

5. The boundary acoustic wave device according to claim 1, wherein the first dielectric layer is made of SiO$_2$ or SiON.

6. The boundary acoustic wave device according to claim 5, wherein the first dielectric layer is made of SiO$_2$, and a normalized thickness of the first dielectric layer, which is obtained by normalization of the set thickness of the first dielectric layer with a wavelength λ of the Stoneley wave, is equal to or less than about 1.4.

7. The boundary acoustic wave device according to claim 1, wherein the first dielectric layer is made of SiO$_2$, and when a duty ratio of the IDT electrode and h×a/λ obtained by multiplying a wavelength normalized thickness h/λ of the IDT electrode, which is obtained by normalization with a wavelength λ, by a ratio a of a density of the IDT electrode to a density of Pt, are within each of regions J1 to J13 shown in FIG. 9, a wavelength normalized thickness H/λ of the first dielectric layer, which is obtained by normalization of the set thickness of the first dielectric layer with the wavelength λ, is equal to or less than a value described in Table 1 below:

TABLE 1

|     | Normalized thickness of first dielectric layer (H/λ) |
|-----|------------------------------------------------------|
| J1  | 1.40 |
| J2  | 1.39 |
| J3  | 1.38 |
| J4  | 1.37 |
| J5  | 1.36 |
| J6  | 1.35 |
| J7  | 1.34 |
| J8  | 1.33 |
| J9  | 1.32 |
| J10 | 1.31 |
| J11 | 1.30 |

TABLE 1-continued

| | Normalized thickness of first dielectric layer (H/λ) |
|---|---|
| J12 | 1.29 |
| J13 | 1.28. |

8. The boundary acoustic wave device according to claim 1, wherein the first dielectric layer is made of $SiO_2$, and when an Euler angle θ of the piezoelectric substrate and h×a/λ obtained by multiplying a wavelength normalized thickness h/λ of the IDT electrode, which is obtained by normalization with a wavelength λ, by a ratio a of a density of the IDT electrode to a density of Pt, are within each of regions K1 to K11 shown in FIG. 10, a wavelength normalized thickness H/λ of the first dielectric layer, which is obtained by normalization of the set thickness of the first dielectric layer with the wavelength λ, is equal to or less than a value described in Table 2 below:

TABLE 2

| | Normalized thickness of first dielectric layer (H/λ) |
|---|---|
| K1 | 1.39 |
| K2 | 1.38 |
| K3 | 1.37 |
| K4 | 1.36 |
| K5 | 1.35 |
| K6 | 1.34 |
| K7 | 1.33 |
| K8 | 1.32 |
| K9 | 1.31 |
| K10 | 1.30 |
| K11 | 1.29. |

* * * * *